United States Patent
Rauber

(10) Patent No.: US 9,997,550 B2
(45) Date of Patent: Jun. 12, 2018

(54) PHOTODETECTOR ON SILICON-ON-INSULATOR

(71) Applicant: STMicroelectronics SA, Montrouge (FR)

(72) Inventor: Bruno Rauber, Goncelin (FR)

(73) Assignee: STMICROELECTRONICS SA, Montrouge (FR)

( * ) Notice: Subject to any disclaimer, the term of this patent is extended or adjusted under 35 U.S.C. 154(b) by 0 days. days.

(21) Appl. No.: 14/627,038

(22) Filed: Feb. 20, 2015

(65) Prior Publication Data

US 2015/0249179 A1 Sep. 3, 2015

(30) Foreign Application Priority Data

Feb. 28, 2014 (FR) ..................... 14 51651

(51) Int. Cl.
  *H01L 27/14* (2006.01)
  *H01L 31/101* (2006.01)
  *H01L 31/11* (2006.01)
  *H01L 27/144* (2006.01)

(52) U.S. Cl.
  CPC ........ *H01L 27/1446* (2013.01); *H01L 31/101* (2013.01); *H01L 31/11* (2013.01)

(58) Field of Classification Search
  CPC ..... H01L 27/1446; H01L 31/101; H01L 31/11
  USPC .......... 257/84, 101, 186, 443, 446, 459, 621
  See application file for complete search history.

(56) References Cited

U.S. PATENT DOCUMENTS

| 5,847,422 A | 12/1998 | Chi et al. |
| 6,229,165 B1 | 5/2001 | Sakai et al. |
| 6,737,626 B1 * | 5/2004 | Bidermann ....... H01L 27/14609 250/208.1 |
| 2002/0185700 A1 * | 12/2002 | Coffa .................. H01L 31/0288 257/431 |
| 2003/0109142 A1 * | 6/2003 | Cable .................. G02B 6/4231 438/708 |
| 2009/0121236 A1 * | 5/2009 | Worley .................. H01L 27/15 257/84 |

FOREIGN PATENT DOCUMENTS

| WO | WO-2004038806 A1 | 5/2004 |
| WO | WO-2011019913 A1 | 2/2011 |

OTHER PUBLICATIONS

INPI Search Report and Written Opinion for FR 1451651 dated Dec. 16, 2014 (8 pages).
Weiquan Zhang et al : "Performance of a CMOS Compatible Lateral Bipolar Photodector en SOI Substrate", IEEE Electron Device Letters, IEEE Service Center, New York, NY, US, vol. 19, No. 11, Nov. 1, 1998 (Nov. 1, 1998), XP011018496.

(Continued)

*Primary Examiner* — Lynne Gurley
*Assistant Examiner* — Vernon P Webb
(74) *Attorney, Agent, or Firm* — Crowe & Dunlevy

(57) ABSTRACT

A photodetector is formed in a silicon-on-insulator (SOI) type semiconductor layer. The photodetector includes a first region and a second region of a first conductivity type separated from each other by a central region of a second conductivity type so as to define a phototransistor. A transverse surface of the semiconductor layer is configured to receive an illumination. The transverse surface extends orthogonally to an upper surface of the central region.

22 Claims, 4 Drawing Sheets

(56) References Cited

OTHER PUBLICATIONS

Fadavi Roudsari A et al : "Highly sensitive, silicon-on-insulator nanowire based photodetector : Device optimization and analysis", Nanotechnology (IEEE, Nano), 2011 111th IEEE Conference on, IEEE, Aug. 15, 2011 (Aug. 15, 20111), pp. 873-876, XP032105384.

* cited by examiner

US 9,997,550 B2

PHOTODETECTOR ON SILICON-ON-INSULATOR

PRIORITY CLAIM

This application claims the priority benefit of French Application for Patent No. 1451651, filed on Feb. 28, 2014, the contents of which is hereby incorporated by reference in its entirety to the maximum extent allowable by law.

TECHNICAL FIELD

The present disclosure relates to photodetectors formed in a semiconductor layer formed of one or a plurality of conductive materials, the semiconductor layer being of SOI (semiconductor-on-insulator) type.

BACKGROUND

For certain applications, particularly in photonics, it is desirable to have a photodetector formed in an SOI-type semiconductor layer with a transverse illumination.

SUMMARY

An embodiment provides a photodetector formed in an SOI-type semiconductor layer, the photodetector comprising a first region and a second region of a first conductivity type separated from each other by a central region of the second conductivity type, and a transverse surface submitted to an illumination extending orthogonally to the upper surface of the central region.

According to an embodiment, the first conductivity type is type N and the second conductivity type is type P.

Another embodiment provides a method of using the photodetector, wherein a ground voltage is applied to the first region and a positive voltage is applied to the second region, the central region being left floating.

According to an embodiment, a contact is arranged on the upper surface of the central region.

According to an embodiment, a contact is arranged astride the first region and the central region.

According to an embodiment, the first region is interrupted by an extension of the central region and a contact is arranged on the upper surface of the extension.

According to an embodiment, the first region and the second region are interrupted by extensions of the central region and a contact is arranged on the upper surface of each extension.

Another embodiment provides a method of using the photodetector, wherein a positive voltage is applied to the second region and a ground voltage is applied to the first region and to the central region.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION OF THE DRAWINGS

Figure 1:
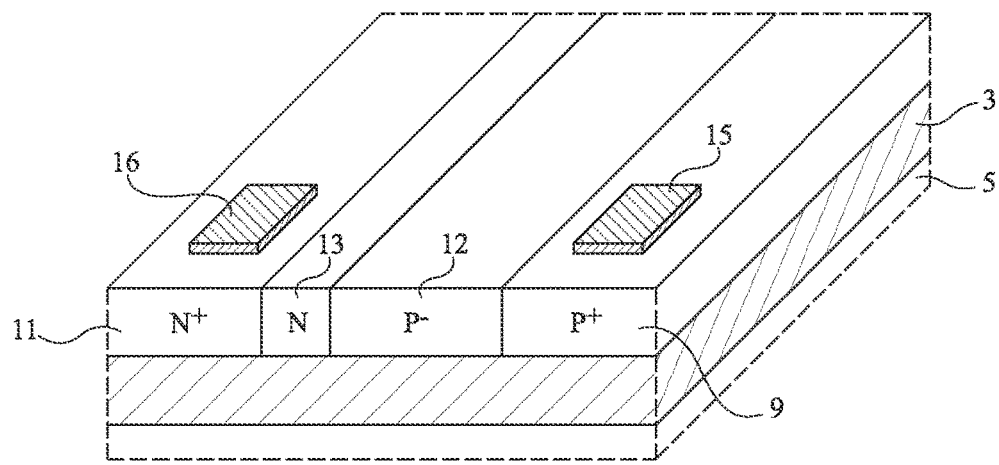
FIG. 1 is a simplified transverse perspective cross-section view of a photodiode on SOI.

For clarity, the same elements have been designated with the same reference numerals in the various drawings and the various drawings are not to scale.

FIG. 1 is a transverse perspective cross-section view schematically showing a photodiode formed in an SOI-type semiconductor layer, the SOI layer resting on an insulating layer 3, itself resting on a semiconductor substrate 5.

The photodiode comprises a heavily-doped P-type semiconductor layer 9 (P+) and a heavily-doped N-type semiconductor layer 11 (N+) longitudinally extending on either side of a lightly-doped P-type central region 12 (P−). FIG. 1 also shows a region 13 having an intermediate N doping level extending between P− region 12 and N+ region 11. Region 13 corresponds to a diffusion area of heavily-doped N-type region 11 (N+) in lightly-doped P-type central region 12 (P−). Metal contacts 15 and 16 rest on the respective upper surfaces of region 9 and of region 11.

When the photodiode is reverse-biased and light rays reach its upper surface, electron-hole pairs are created in regions 12 and 13 and a current is generated.

In the photodiode of FIG. 1, it may be decided that light rays hit a transverse surface rather than the upper surface of the SOI-type semiconductor layer. The light rays may be guided to the transverse surface, for example, by a waveguide formed in the SOI-type semiconductor layer or by an optical fiber. The intensity of the current generated in the photodiode thus illuminated mainly depends on the electron-hole pairs created in the space charge area of the PN junction, that is, on the light rays reaching a portion of the transverse surface located on either side of the PN junction. Thus, a portion only of the light rays reaching the transverse surface submitted to an illumination takes part in the generation of current and the generated current is weak.

Figure 2:
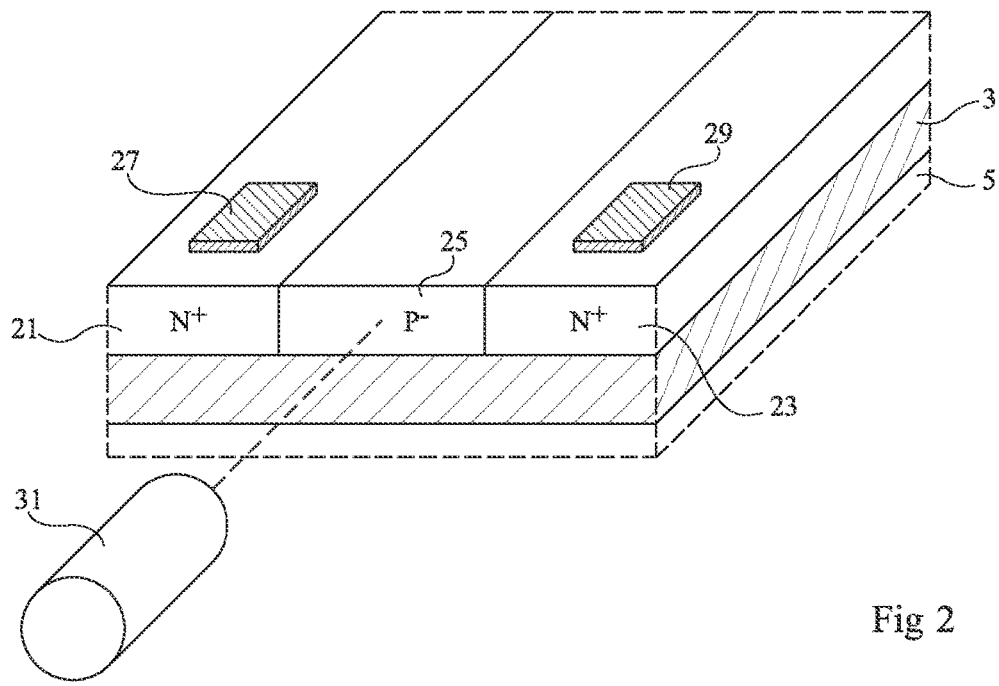
FIG. 2 is a simplified transverse perspective cross-section view of an embodiment of a phototransistor on SOI.

FIG. 2 is a transverse perspective cross-section view schematically showing an embodiment of a phototransistor formed in an SOI-type semiconductor layer, the SOI layer resting on an insulating layer 3, itself resting on a semiconductor substrate 5.

The phototransistor comprises two heavily-doped N-type semiconductor regions 21 and 23 ($N^+$) longitudinally extending on either side of a lightly-doped P-type central region 25 ($P^-$). Metal contacts 27 and 29 rest on the upper surfaces, respectively, of region 21 and of region 23. Regions 21, 25, and 23 respectively form the phototransistor emitter, base, and collector.

In operation, light rays originating from a source 31 (waveguide or optical fiber) illuminate a transverse surface of region 25 of the phototransistor. The photo-transistor is biased by the application, for example, of a ground voltage to contact 27 and of a positive voltage, for example, 1 V, to contact 29. The base is left floating (that is, is not connected). When light rays reach the transverse surface of base region 25, electron-hole pairs are created and a current is generated.

In such a phototransistor, all the light rays reaching the transverse surface of base region 25 are capable of creating electron-hole pairs taking part in the generation of a current, conversely to the case of a photodiode of the type in FIG. 1, where only the light rays reaching the space charge area located on either side of the PN junction take part in the generation of a current. Thus, in the above-described case of a transverse-illumination photodetector formed in an SOI-type semiconductor layer, using a phototransistor rather than a photodiode is particularly advantageous, this advantage adding to the gain effect due to the transistor effect.

Figure 3:
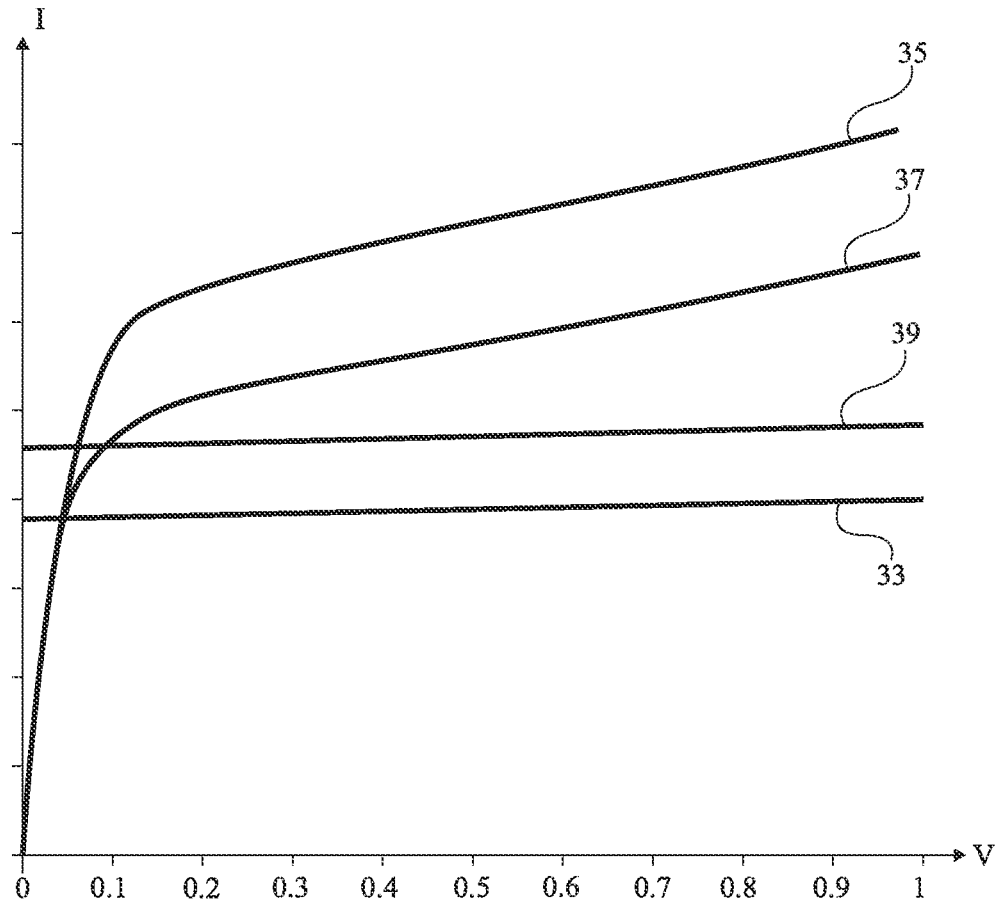
FIG. 3 shows the variation of the current generated in various types of photodetectors versus the bias voltage.

FIG. 3 illustrates the variation, according to bias voltage V, of current I generated by various transverse-illumination photodetectors, current I being indicated in arbitrary linear scale.

Curve 33 illustrates the dependence between current I generated by a photodiode of the type in FIG. 1 and bias voltage V applied between contacts 15 and 16, the photodiode being reverse biased. Curve 35 illustrates current I generated by a phototransistor having a floating base, such as that in FIG. 2, according to bias voltage V applied between contacts 27 and 29.

For bias voltages V in the range from 0.1 to 1 V, current I generated in the phototransistor (curve 35) is greater than the current generated in the photodiode (curve 33).

FIGS. 4 to 7 are cross-section and perspective views schematically showing variations of the phototransistor of FIG. 2 where the same elements are designated with the same reference numerals. All these variations provide a connection to base 25 of the phototransistor.

Figure 4:
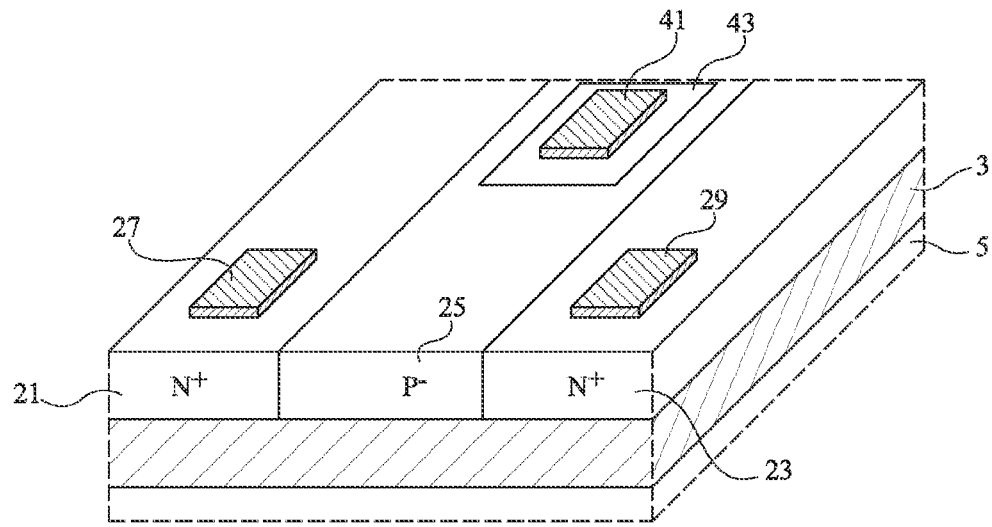
FIGS. 4 to 7 are simplified transverse perspective cross-section views of alternative embodiments of a phototransistor on SOI.

In the variation of FIG. 4, a metal contact 41 is arranged on an overdoped area 43 of base region 25. The contact is substantially centered on base region 25.

Figure 5:
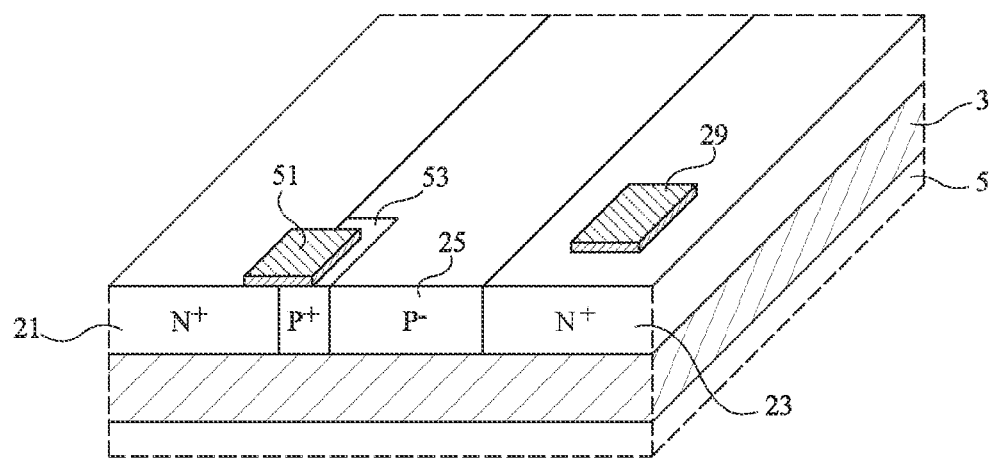

In the variation of FIG. 5, a metal contact 51 overlaps emitter region 21 and an overdoped area 53 of base region 25.

Figure 6:
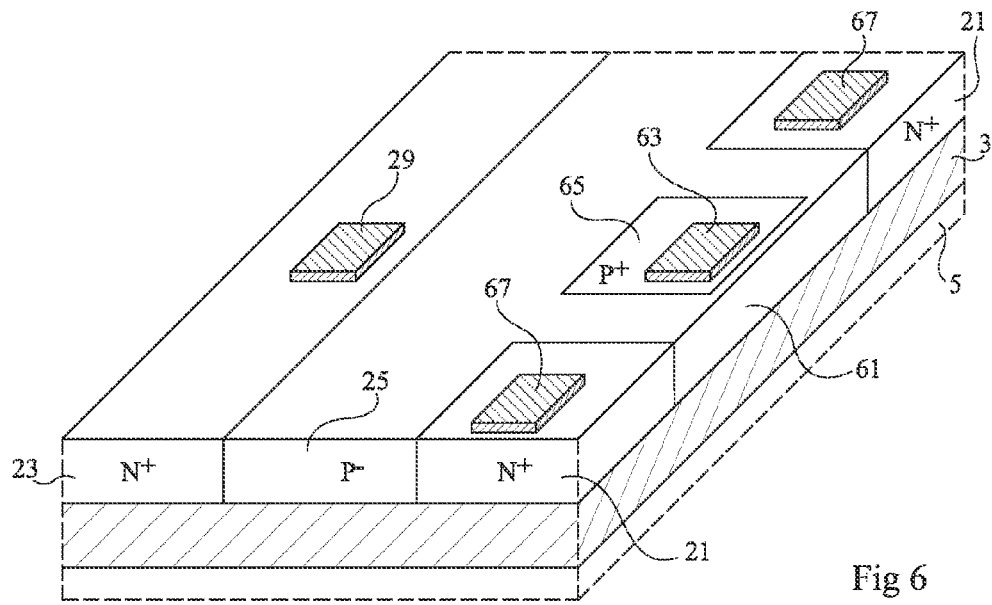

In the variation of FIG. 6, base region 25 comprises an extension 61 (to the right of the drawing) interrupting emitter region 21. A metal contact 63 is arranged on an overdoped area 65 of extension 61 of region 25. A metal contact 67 is arranged on each of the portions of emitter region 21.

Figure 7:
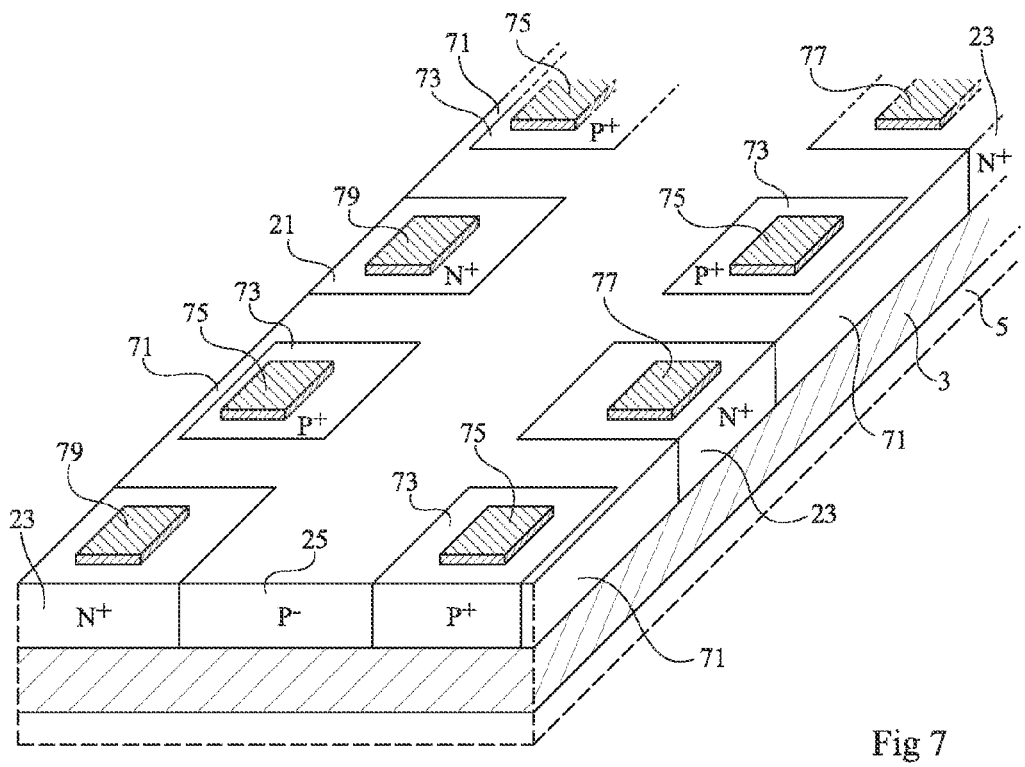

In the variation of FIG. 7, base region 25 comprises extensions 71 regularly interrupting emitter region 21 and collector region 23. Thus, the emitter region is divided into emitter region portions and the collector region is divided into collector region portions. In each extension 71 of base region 25 is formed a P-type overdoped area 73 ($P^+$) having a metal contact 75 arranged thereon. A metal contact 79 is arranged on each portion of emitter region 21 and a metal contact 77 is arranged on each portion of collector region 23.

In operation, base region 25 of each of the phototransistors of FIGS. 4 to 7 may be biased, for example, set to the same voltage as emitter region 21, which voltage may be the ground voltage.

Referring again to FIG. 3, curve 37 illustrates the dependence between the current generated in a phototransistor of the type in FIG. 5 and voltage V applied between contacts 51 and 29. Curve 39 illustrates this same current in a phototransistor of the type in FIG. 7, voltage V being applied between contacts 77 and 79. In the phototransistors corresponding to curves 37 and 39, a same voltage is applied to the base and to the emitter.

Current I of the floating-base phototransistor of FIG. 2 (curve 35) is greater than that of the phototransistors of FIGS. 5 and 7 (curves 37 and 39). Thus, a floating-base phototransistor can be preferably used in applications where as high a generated current as possible is desired.

Although current I of curves 37 and 39 is lower than that of curve 35, the biasing to the same voltage of the base and of the emitter of the phototransistors of curves 37 and 39 results in a cut-off frequency of these phototransistors much higher than that of a floating-base transistor of the type in FIG. 2. Thus, a phototransistor of the type in FIGS. 4 to 7 may be preferably used in applications where as high a cut-off frequency as possible is desired.

Further, current I of curve 39 is almost constant whatever bias voltage V while current I of curves 35 and 37 increases along with bias voltage V. Thus, a phototransistor of the type in FIG. 7, where contacting areas towards the base region regularly interrupt the collector and emitter regions, can be preferably used in applications where the generated current is desired to be as constant as possible during variations of the bias voltage.

In the phototransistors of FIGS. 2 and 4 to 7, the material of the semiconductor layer is selected not to be transparent to the wavelength of the received light. The semiconductor layer may comprise a plurality of areas, for example, made of silicon, of germanium, or of a group-III-V semiconductor. As an example, the semiconductor layer having the phototransistor formed therein comprises a germanium layer in the case where the wavelength of the received light is in the range from 0.75 to 3.00 µm, for example, 1.40 µm. Insulating layer 3 may be made of silicon oxide. Contacts 27, 29, 41, 51, 63, 67, 75, 77, and 79 are for example made of aluminum.

A dimension of a region or of a portion will be considered as being its width if this dimension is parallel to the illuminated transverse surface, and to the upper surface of the SOI-type semiconductor layer, and will be considered as its length if this dimension is orthogonal to the illuminated transverse surface. As an example of dimensions, the width of region 25 is in the range from 0.3 to 0.5 µm, for example, 0.4 µm. The width of regions 21 and 23 may be in the range from 0.2 to 0.4 µm, for example, 0.3 µm. The length of regions 21, 23, and 25 may be in the range from 2 to 30 µm, for example, 15 µm. The length of extension 61 and of an extension 71 may be in the range from 0.5 to 3 µm, for example, 1.5 µm. The thickness of the semiconductor layer may be in the range from 0.2 to 0.5 µm, for example, 0.3 µm.

In an optoelectronic technological process, the forming of layers, regions, or portions having different doping levels is usually provided, the available doping concentrations will for example be:

from $10^{17}$ to $10^{18}$ at./cm$^3$ for lightly-doped P-type region 25 ($P^-$), greater than $10^{19}$ at./cm$^3$ for $P^+$ overdoped contacting areas 43, 53, 65, and 73, and greater than $10^{19}$ at./cm$^3$ for heavily-doped N-type regions 21 and 23 ($N^+$).

Specific embodiments have been described. Various alterations and modifications will occur to those skilled in the art. In particular, the conductivity types of emitter, base, and collector regions 21, 25, and 23 indicated as an example in relation with the above embodiments may all be reversed, the bias voltages being reversed. The doping levels of the regions and of the areas indicated as an example may be adapted according, for example, to the various technological processes used.

The dimensions of the regions, of the extensions of regions, and of the areas indicated as an example may be adapted according, for example, to the wavelength of the received light rays.

More generally, the topography of the regions, of the extensions of regions, of the overdoped areas, and of the phototransistors described hereabove may be modified by those skilled in the art. In particular, it will be within the abilities of those skilled in the art to adapt the number of contacting areas and the number of metal contacts according to the length of the base region.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A system comprising a source of illumination and a photodetector, comprising:
   an SOI-type semiconductor layer including a first region of a first conductivity forming an emitter of a photodetecting phototransistor, and a second region of the first conductivity type forming a collector of the photodetecting phototransistor, said first and second regions separated from each other by a central region of a second conductivity type forming a base of the photodetecting phototransistor, and
   said SOI-type semiconductor layer having a bottom surface in contact with an insulator layer and a top surface opposite the bottom surface and having a transverse surface at said central region, said transverse surface extending orthogonally to top and bottom surfaces of the SOI-type semiconductor layer,
   wherein the source of illumination generates a beam of light that orthogonally illuminates the transverse surface at said central region.

2. The system of claim 1, wherein the first conductivity type is type N and the second conductivity type is type P.

3. The system of claim 2, further including a first contact configured to receive a ground voltage for application to the first region and a second contact configured to receive a positive voltage for application to the second region, wherein the central region is left floating.

4. The system of claim 1, further comprising a contact arranged on the upper surface of the central region.

5. The system of claim 4, wherein the first conductivity type is type N and the second conductivity type is type P.

6. The system of claim 5, further comprising circuitry configured to apply a positive voltage to the second region and a ground voltage to the first region and the central region.

7. The system of claim 1, further comprising a contact arranged astride the first region and the central region.

8. The system of claim 1, further comprising:
   an extension of the central region configured to interrupt the first region; and
   a contact arranged on an upper surface of the extension.

9. The system of claim 1, further comprising:
   extensions of the central region configured to interrupt the first region and the second region; and
   a contact is arranged on an upper surface of each extension.

10. A system comprising a source of illumination and a photodetector, comprising:
    an insulating layer;
    a semiconductor layer on said insulating layer;
    wherein said semiconductor layer includes:
       a first region doped with a first conductivity type and in contact with a top surface of the insulating layer;
       a second region adjacent the first region and in contact with a top surface of the insulating layer, the second region doped with a second conductivity type in; and
       a third region adjacent the second region and in contact with a top surface of the insulating layer, the third region doped with the first conductivity type;
    said first, second and third regions forming a photodetecting bipolar phototransistor device; and
    a transverse surface at said second region that receives an illumination, said transverse surface extending orthogonally to an upper surface of the semiconductor layer.

11. The system of claim 10, further comprising:
    a first contact on said first region configured to receive a ground voltage; and
    a second contact on said third region configured to receive a positive voltage.

12. The system of claim 11, where the central region is left floating.

13. The system of claim 10, wherein the second region includes an overdoped region and further comprising a contact on said overdoped region.

14. The system of claim 10, wherein the second region includes an overdoped region and further comprising:
    a first contact overlapping said first region and said overdoped region; and
    a second contact on said third region.

15. The system of claim 10, wherein said third region comprises first and second sub-regions separated from each other by an extension of the second region and further comprising:
    a first contact on said first region;
    a second contact on first sub-region; and
    a third contact on said second sub-region.

16. The system of claim 15, wherein the second region includes an overdoped region and further comprising a fourth contact on said overdoped region.

17. The system of claim 10, wherein said first, second and third regions form, respectively, emitter, base and collector nodes of said bipolar phototransistor device.

18. A system comprising a source of illumination and a photodetecting phototransistor, comprising:
    an insulating layer;
    a semiconductor layer having a bottom surface on said insulating layer and having a top surface opposite the bottom surface;
    wherein said semiconductor layer includes:
       an emitter region of the photodetecting phototransistor doped with a first conductivity type and in contact with a top surface of the insulating layer;
       a base region of the photodetecting phototransistor in contact with the emitter region and in contact with a top surface of the insulating layer, the base region doped with a second conductivity type; and
       a collector region of the photodetecting phototransistor in contact with the base region and in contact with a top surface of the insulating layer, the collector region doped with the first conductivity type; and
       a transverse surface at said base region extending between the top and bottom surfaces of the semiconductor layer; and
    wherein the source of illumination applies a beam of light that orthogonally illuminates the transverse surface at said base region.

19. The system of claim 18, wherein the base region includes an overdoped region and further comprising a contact on said overdoped region.

20. The system of claim 18, wherein the base region includes an overdoped region and further comprising:
    a first contact overlapping said emitter region and said overdoped region; and
    a second contact on said collector region.

21. The system of claim 18, wherein said collector region comprises first and second sub-regions separated from each other by an extension of the base region and further comprising:
   a first contact on said emitter region;
   a second contact on first sub-region; and
   a third contact on said second sub-region.

22. The system of claim 18, wherein the base region includes an overdoped region and further comprising a fourth contact on said overdoped region.

* * * * *